(12) United States Patent
Jones et al.

(10) Patent No.: US 6,268,732 B1
(45) Date of Patent: Jul. 31, 2001

(54) METHOD AND APPARATUS FOR AUTOMOTIVE AND OTHER BATTERY TESTING

(75) Inventors: Barbara L. Jones; Paul Smith, both of King's Lynn (GB)

(73) Assignee: Snap-on Equipment Limited, King's Lynn (GB)

(*) Notice: Subject to any disclaimer, the term of this patent is extended or adjusted under 35 U.S.C. 154(b) by 0 days.

(21) Appl. No.: 09/555,185

(22) PCT Filed: Sep. 29, 1999

(86) PCT No.: PCT/GB99/03037

§ 371 Date: Jul. 13, 2000

§ 102(e) Date: Jul. 13, 2000

(87) PCT Pub. No.: WO00/19225

PCT Pub. Date: Apr. 6, 2000

(30) Foreign Application Priority Data

Sep. 30, 1998 (GB) ................................. 9821121

(51) Int. Cl.[7] ............................................. G01N 27/416
(52) U.S. Cl. ............................................. 324/429; 324/433
(58) Field of Search ............................................. 324/429, 426, 324/433, 432, 427

(56) References Cited

U.S. PATENT DOCUMENTS

| | | |
|---|---|---|
| 3,680,072 | 7/1972 | Charbonnier et al. . |
| 3,731,189 | 5/1973 | Sharaf et al. . |
| 3,808,487 | 4/1974 | Feuillade . |
| 4,052,717 | 10/1977 | Arnold et al. . |
| 4,231,027 | 10/1980 | Mann et al. . |
| 4,259,639 | 3/1981 | Renirie . |
| 4,432,360 | 2/1984 | Mumford et al. . |
| 4,719,428 | 1/1988 | Liebermann . |
| 4,743,855 | 5/1988 | Randin et al. . |
| 4,881,038 | 11/1989 | Champlin . |
| 4,912,416 | 3/1990 | Champlin . |
| 5,140,269 | 8/1992 | Champlin . |
| 5,191,291 | * 3/1993 | Taylor ................................. 324/429 |
| 5,751,217 | 5/1998 | Kchao et al. . |
| 5,773,977 | 6/1998 | Dougherty . |
| 5,773,978 | 6/1998 | Becker . |
| 5,821,756 | 10/1998 | McShane et al. . |
| 5,828,218 | 10/1998 | Yokoo et al. . |
| 5,899,947 | 5/1999 | Hall et al. . |
| 5,914,605 | 6/1999 | Bertness . |
| 6,037,778 | * 3/2000 | Makhija ............................. 324/433 |

FOREIGN PATENT DOCUMENTS

| | | |
|---|---|---|
| 0756167 A2 | * 1/1997 | (EP) . |
| 0762135 A2 | * 12/1997 | (EP) . |
| 04-364489 | * 12/1992 | (JP) . |
| 06-043226 | * 2/1994 | (JP) . |
| 09-027349 | * 1/1997 | (JP) . |

* cited by examiner

Primary Examiner—Peter S. Wong
Assistant Examiner—Gregory J. Toatley, Jr.
(74) Attorney, Agent, or Firm—Seyfarth Shaw

(57) ABSTRACT

A method of testing applicable to the routine testing of batteries for automotive vehicles and like batteries is described. The method comprises: providing a battery to be tested; providing a test electrical load for connection to the battery; providing a control circuit to connect the load to the battery for an interval of less than one second; and providing analysis means to analyze the battery's reaction to said load. The invention is characterized by causing the load to cause the battery to deliver a macro-current which is comparable to currents arising in use of the battery; causing said control circuit to connect the load to the battery for a transient time interval lying in the range of up to 100 milliseconds; and providing the control circuit as part of handset apparatus adapted to be operated and connected to the battery in the manner of a testing handset, and the transient macro-current generating an amount of heat in relation to the handset which can be accommodated by apparatus of the handset kind.

10 Claims, 2 Drawing Sheets

US 6,268,732 B1

METHOD AND APPARATUS FOR AUTOMOTIVE AND OTHER BATTERY TESTING

BACKGROUND

This invention relates to a method and apparatus for automotive and other battery testing. Particularly, but not exclusively, the invention relates to such method and apparatus applicable to the roadside testing of automotive vehicles' batteries, and the corresponding testing of such vehicles' batteries in diagnostic and service-orientated functions. One particular practical application of the embodiments of the invention lies in the provision of a method and apparatus of particular utility for patrol personnel offering roadside assistance to automotive vehicle users.

The invention is likely to find utility in related non-automotive applications.

A particular practical problem in the field of fault diagnosis in automotive vehicles lies in providing a simple practical means whereby common faults in relation to basic automotive systems can be readily identified. Of course, computer-based total vehicle analysis systems are available for analysis purposes, and these are effective. However, such systems are usually dedicated to one specific vehicle model and are thus applicable only to that extremely narrow range of vehicles, and in any case are not suitable for roadside use.

Another problem which arises relates to the fact that many faults are intermittent in nature and are generally untraceable using current conventional equipment until the fault has become so bad that it is present at all times.

A further requirement is that methods and apparatus of this kind need to be readily used by a roadside assistance patrol person under adverse weather conditions, and under similarly adverse conditions so far as the state of maintenance of the vehicle to be tested is concerned, and having regard to the fact that many modern vehicles are constructed so as to be highly resistant to the ingress of rain, snow and automotive lubrication and other fluids, whereby it is relatively difficult to gain access to some at least of the operating systems of a vehicle, notably the starter system and related electrical components.

Looking generally at the state of the art in relation to battery testing, prior proposals include our own battery testing handset system (reference P53488WO) as disclosed in PCT/GB98/01634, which is presently unpublished, and which discloses three battery test systems, at least one of which includes the use of transient battery loading and/or charging steps.

Another prior proposal, which in this case is published, is set forth in EP 0756167A (U.S. Pat. No. 6,157,877) which discloses the use of neural networks in relation to the analysis of transient battery test loads.

Previously proposed battery test systems have been capable of yielding useful data, but it is believed that more valuable data may be available by the use of a modified test technique, and such data may be available just as conveniently as in previous handset systems, by the use of handset apparatus and may be able to provide data which represents a more realistic assessment of a battery's actual in-use performance characteristics, and which is nevertheless capable of being supplied in a cost-effective manner.

SUMMARY

According to the invention there is provided a method and apparatus applicable to the routine testing of batteries for automotive vehicles, and like batteries, as defined in the accompanying claims.

In an embodiment of the invention convenience of use is ensured by the use of a handset system, access to test data representing a realistic appraisal of the battery's actual performance ability is provided by causing the battery to deliver a current which represents (if not the current which it would actually deliver in use), at least a realistic approximation thereto, and cost-effectiveness is achieved or made available by the use of a testing circuit in which the realistic battery currents are generated for a transient time interval such that despite the use of a handset, heat generated is relatively low and can be accommodated within cost-effective system components. In this manner the embodiment of the invention provides a convenient and effective and cost-effective battery test system which is able to simulate actual battery operating conditions and thus to obtain a measure of the battery's performance in relation to same without the need for substantial heat sink arrangements nor other complexities which have limited the utility of previously proposed systems.

In the described embodiment a control circuit forming part of the testing handset is adapted to connect a test electrical load to a battery to be tested. Analysis means is adapted to analyse the voltage profile produced, or to analyse related aspects of the battery's reaction to the load. The embodiment is characterised by the feature that the load is caused, at least for batteries in good condition, to effect the production by the battery of a macro current which is comparable to currents arising in use of the battery, and the load is connected to the battery for a transient time interval lying in the range of up to 100 milliseconds, for example 10 to 30 milliseconds, whereby the heat generated by the transient macro current can be accommodated by the handset apparatus.

The use in the embodiment of a transient macro current enables the production of test data corresponding in a reasonably realistic manner to that which would be obtainable in actual test use of the battery, but without the attendant heat and other related difficulties which have hitherto ruled out such an approach in handset-type testing apparatus.

Likewise in the embodiment, the control circuit produces the predetermined and required level of current flow by means of a closed loop feedback circuit which effectively serves to demand the preset level of test current which the system deems applicable in a given case. In the embodiment, the current level is determined by the system in accordance with the open-circuit voltage available from the battery and in practice the embodiment uses four levels of open-circuit voltage to determine four corresponding levels of battery current lying in the region of 100 to 120 amps, 47 to 55 amps, 18 to 25 amps, and 12 to 17 amps.

By the use of a closed loop current-control circuit in the embodiment there is provided the advantage (for production purposes) that circuit component tolerances (particularly in field-effect transistors [FETs]) which would otherwise have led to unacceptable variations (within a production batch) in the resistive load applied to the battery are effectively controlled.

To put in context the actual amperage figures quoted above in relation to the testing handset of the present embodiments, it needs to be kept in mind that previously known equipment of this kind has employed handset test currents of the order of 2 amps.

Another feature of the described embodiment relates to its use of a twin pulse testing technique in which it is the second pulse (delivered by the battery to the load) which is utilised for test purposes, the first such pulse being a preliminary pulse which (it has been found) results in an improved test performance by effectively conditioning the battery.

In relation to the time interval during which the transient load is applied to the battery, the embodiments use, in some cases, a transient main load/current pulse falling within the defined time intervals discussed herein, and followed by a relatively long current decay period which is at least as long, and sometimes several times longer, than the transient load interval.

In the embodiments described the transient load-switching function is effected by a digitally controlled circuit employing field-effect transistors, but the same or comparable intervals of load connection can be effected by analogue circuits and it is intended that the accompanying claims shall cover both systems accordingly.

Alternative circuits for applying a transient current load in accordance with the invention include pulse-width-modulation (PWM) techniques which allow current load pulse shaping by varying the PWM mark/space ratio. By using PWM in an H-bridge circuit configuration incorporating some form of temporary energy storage, a large proportion of the energy used in testing the battery can be returned to the power supply, thus significantly reducing the power dissipation in the handset.

Embodiments of the invention will now be described by way of example with reference to the accompanying drawings in which:

In certain embodiments of the invention, a handset is provided of a size for comfortable hand holding and for operation and control (by the user's thumb) using simple procedures and relatively few buttons with a one-line display (for example) or light-emitting diodes as a user interface.

Also in such an embodiment of the invention, electrical contact access to electrical parts may be simplified by the use of clip connectors to battery terminals utilising a Kelvin connection to remove the degrading effects of dirty contacts. A temperature sensing device may also be incorporated. These system options enhance the accuracy of measurement and diagnosis.

These embodiments reduce the skill and time requirement imposed on the user.

Thus, one aspect of the invention relates principally to systems of testing involving the use of handsets, though certain aspects of the technical advance provided by the embodiments has utility in relation to non-handset equipment and is claimed accordingly.

DETAILED DESCRIPTION

Figure 1:
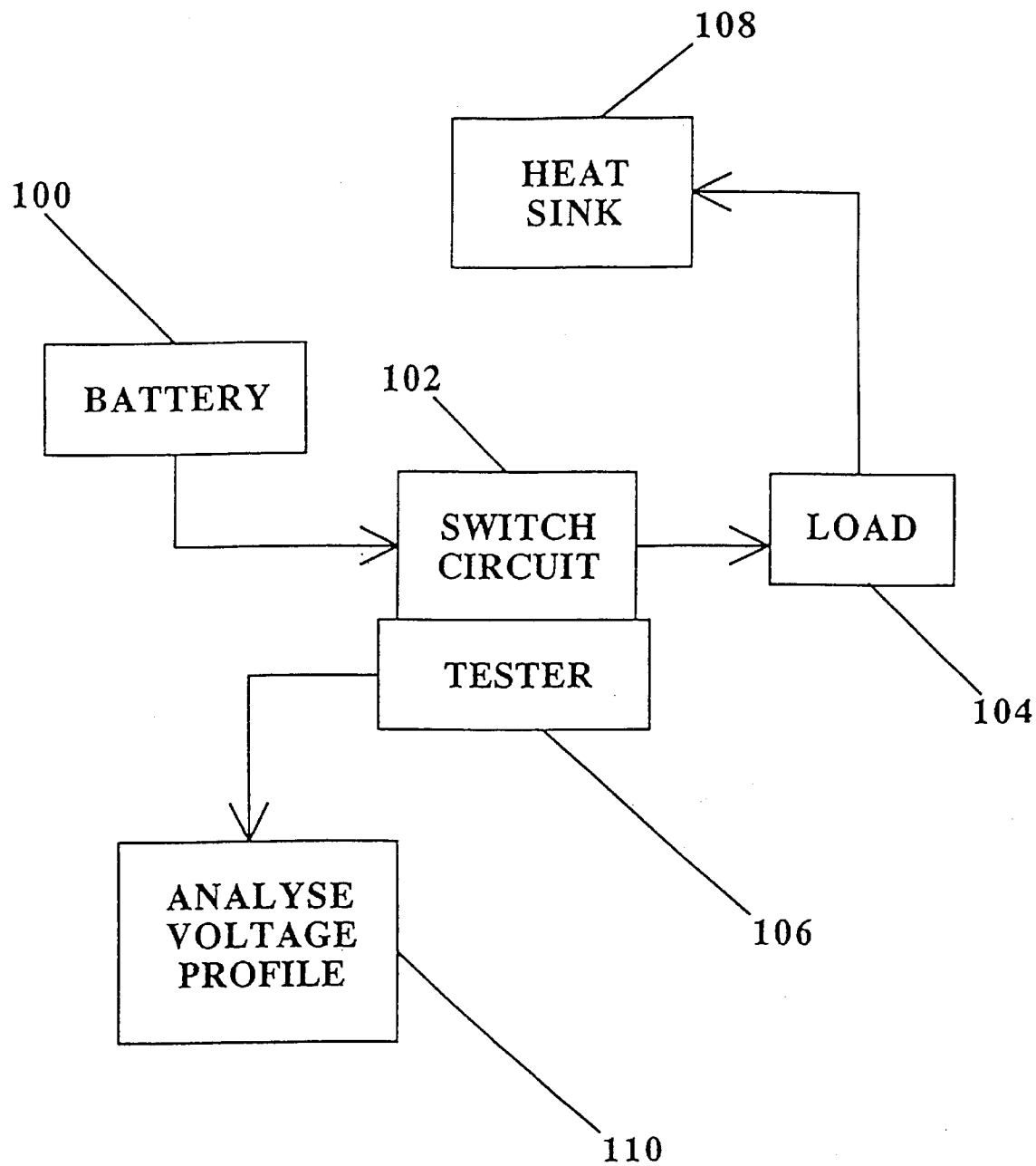
FIGS. 1 and 2 of the accompanying drawings show, respectively, in block/flow diagram format, representations of the prior art and of an embodiment of the present invention.
Figure 2:
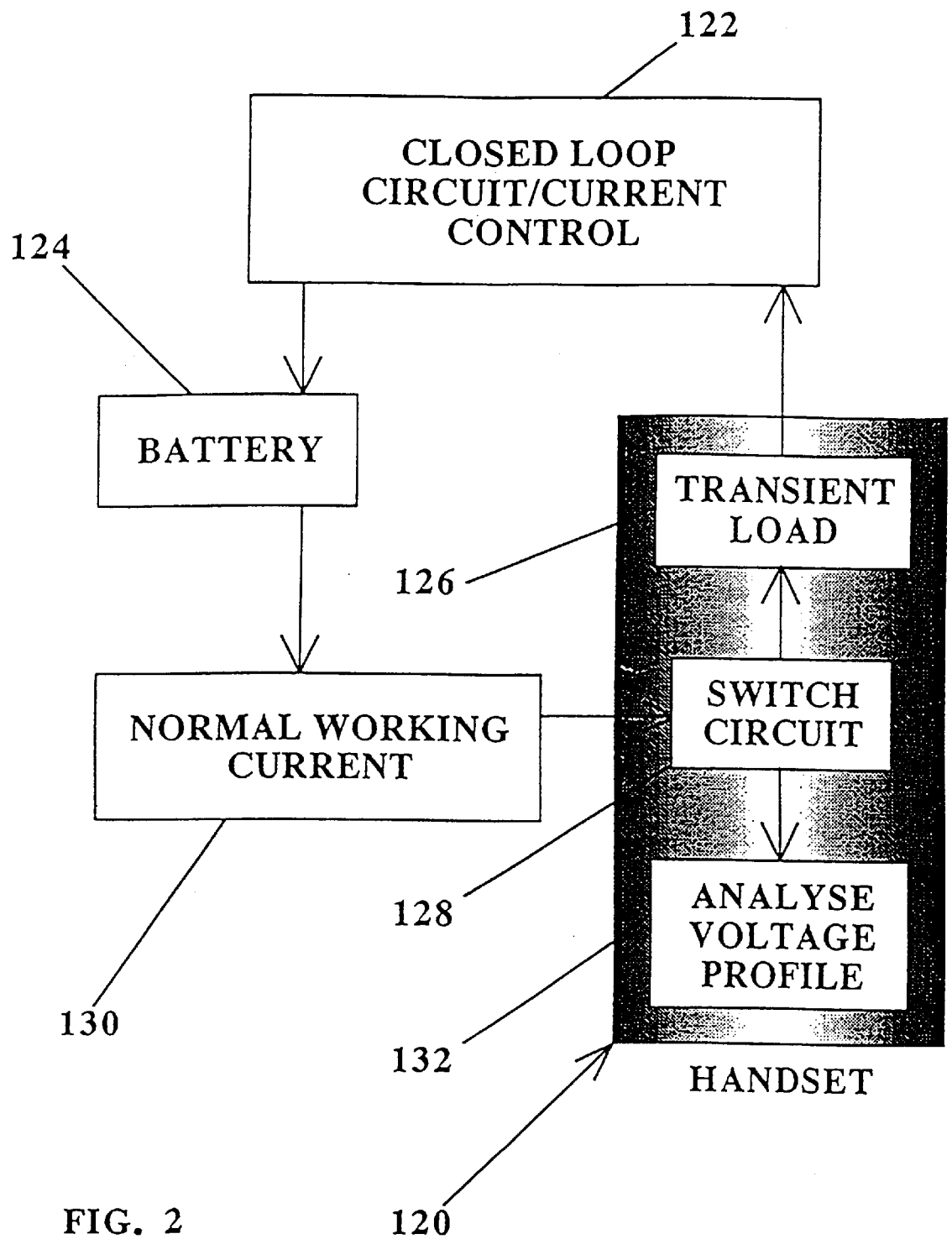

In the embodiment of FIG. 2 (and its corresponding prior art of FIG. 1), in the prior art representation shown in FIG. 1, a battery 100 is connected by a switch circuit 102 to a load 104 forming part of the overall test apparatus 106 and heat generated is absorbed by a heat sink 108 accordingly.

Voltage profile analysis is provided by circuit 110 which determines the category of battery 100 by reference to known voltage data profiles established on a corresponding database.

In the embodiment of FIG. 2, a handset 120 is connected through a closed loop current control circuit 122 to battery 124 for application of transient load 126 by switching circuit 128 to generate the (approximation to) normal working battery current as indicated at 130.

Switch circuit connects load 126 for, typically, about 20 milliseconds and circuit 122 is set up to draw a current of the order of 100 amps from battery 124. The voltage profile produced is analysed accordingly by circuit 132 in accordance with the disclosure in our prior U.S. Pat. No. 6,157,877 identified above, the entire technical content of which is hereby incorporated herein for disclosure purposes.

What is claimed is:

1. A method of testing applicable to the routine testing of batteries for automotive vehicles and like batteries, the method comprising:

a) providing a battery to be tested;
   b) providing a test electrical load for connection to said battery;
   c) providing a control circuit adapted to connect said load to said battery for an interval of less than one second; and
   d) providing analysis means adapted to analyse the voltage profile or related aspects of said battery's reaction to said load over said interval; characterised by
   e) causing said load to cause said battery, at least for batteries in good condition, to deliver a transient macro-current which is comparable to currents arising in use of the battery;
   f) causing said control circuit to connect said load to said battery for a transient time interval lying in the range of up to 100 milliseconds; and
   g) providing said control circuit as part of a handset apparatus adapted to be operated and connected to said battery in the manner of a testing handset, and said transient macro-current generating an amount of heat in relation to said handset which can be accommodated by apparatus of the handset kind.

2. A method according to claim 1 characterised by causing said control circuit to produce a predetermined level of current flow by means of a closed loop feedback circuit.

3. A method according to claim 2 characterised by causing said control circuit to determine the level of current flowing by reference to the open circuit voltage of said battery.

4. A method according to claim 3 characterised by causing said control circuit to determine the level of current flowing by selecting one of two or more voltage levels or ranges by reference to the open circuit voltage of said battery.

5. A method according to any one of claims 1, 2, 3 or 4 characterised by causing said control circuit to connect said load to said battery for said transient time interval so far as peak current flow is concerned, followed by a current decay period from zero to as long as said transient time interval.

6. Apparatus applicable to the routine testing of batteries for automotive vehicles and like batteries, the apparatus comprising:

a) connection means for connecting the apparatus to a battery to be tested;
   b) a test electrical load for connection to said battery to be tested;
   c) a control circuit adapted to connect said load to said battery for an interval of less than one second; and
   d) analysis means adapted to analyse the voltage profile or related aspects of said battery's reaction to said load over said interval; characterised by e) said control circuit being adapted to cause said battery to deliver a transient macro-current which is comparable to currents arising in use of said battery;

f) said control circuit being also adapted to connect said battery to said load for a transient time interval lying in the range of up to 100 milliseconds; and g) said control circuit forming part of handset apparatus adapted to be operated and connected to said battery in the manner of a testing handset, and said transient macro-current generating an amount of heat in use and in relation to said handset which can be accommodated by said handset.

7. Apparatus according to claim 6 characterised by said control circuit comprising a closed loop feedback circuit adapted to produce a predetermined level of current flow from said battery.

8. Apparatus according to claim 7 characterised by said control circuit being adapted to determine the level of current flow from said battery by reference to the open circuit voltage of said battery.

9. Apparatus according to claim 8 characterised by said control circuit being adapted to determine the level of current flow from said battery by selecting one of two or more levels or ranges of current flow by reference to the open circuit voltage of said battery.

10. Apparatus according to any one of claims 6, 9 or 10 characterised by said control circuit being adapted to connect said battery to said load for a transient time interval followed by a current decay period from zero to as long as said transient time interval.

\* \* \* \* \*

UNITED STATES PATENT AND TRADEMARK OFFICE
CERTIFICATE OF CORRECTION

PATENT NO. : 6,268,732 B1
DATED : July 31, 2001
INVENTOR(S) : Jones et al.

It is certified that error appears in the above-identified patent and that said Letters Patent is hereby corrected as shown below:

<u>Column 6,</u>
Line 10, "claims 6, 9 or 10" should be -- claims 6, 7 or 8 --.

Signed and Sealed this

Ninth Day of April, 2002

Attest:

JAMES E. ROGAN
*Director of the United States Patent and Trademark Office*

*Attesting Officer*